(12) United States Patent
Nelson (10) Patent No.: US 9,337,365 B2
(45) Date of Patent: May 10, 2016

(54) TRANSVERSELY-ILLUMINATED HIGH CURRENT PHOTOCONDUCTIVE SWITCHES WITH GEOMETRY-CONSTRAINED CONDUCTIVITY PATH

(71) Applicant: Scott D. Nelson, Patterson, CA (US)

(72) Inventor: Scott D. Nelson, Patterson, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 13/912,137

(22) Filed: Jun. 6, 2013

(65) Prior Publication Data

US 2013/0328146 A1 Dec. 12, 2013

Related U.S. Application Data

(60) Provisional application No. 61/656,467, filed on Jun. 6, 2012, provisional application No. 61/656,470, filed on Jun. 6, 2012, provisional application No. 61/801,483, filed on Mar. 15, 2013.

(51) Int. Cl.
| | | |
|---|---|---|
| H01L 31/0232 | (2014.01) | |
| H01L 31/0224 | (2006.01) | |
| H01L 31/08 | (2006.01) | |
| H01L 31/09 | (2006.01) | |
| G02B 6/42 | (2006.01) | |
| H01L 31/028 | (2006.01) | |
| H01L 31/0296 | (2006.01) | |
| H01L 31/0304 | (2006.01) | |
| H01L 31/0312 | (2006.01) | |
| H01C 7/10 | (2006.01) | |

(52) U.S. Cl.
CPC ........ *H01L 31/02327* (2013.01); *G02B 6/4295* (2013.01); *H01C 7/10* (2013.01); *H01L 31/028* (2013.01); *H01L 31/0224* (2013.01); *H01L 31/0296* (2013.01); *H01L 31/02325* (2013.01); *H01L 31/0312* (2013.01); *H01L 31/03044* (2013.01); *H01L 31/08* (2013.01); *H01L 31/09* (2013.01); *H01C 7/1013* (2013.01)

(58) Field of Classification Search
CPC .................. H01L 31/0224; H01L 31/022408; H01L 31/022416; H01L 31/09; H01L 31/16
USPC .......................................... 257/431, 432, 459
See application file for complete search history.

(56) References Cited

U.S. PATENT DOCUMENTS

| | | | | |
|---|---|---|---|---|
| 5,047,623 | A | * | 9/1991 | Wilcox .......................... 257/432 |
| 5,155,352 | A | * | 10/1992 | Kim et al. ..................... 250/214.1 |
| 5,773,817 | A | * | 6/1998 | Kingsley et al. ....... 257/E31.052 |
| 2012/0082411 | A1 | * | 4/2012 | Sullivan et al. .................. 385/14 |

OTHER PUBLICATIONS

Kelkar, et al., "On-State Characteristics of a High-Power Photoconductive Switch Fabricated From Compensated 6-H Silicon Carbide", IEEE Transactions on Plasma Science, vol. 36, No. 1, pp. 12-17 (Feb. 2008).

* cited by examiner

*Primary Examiner* — Stephen W Smoot
*Assistant Examiner* — Sun M. Kim
(74) *Attorney, Agent, or Firm* — James S. Tak (57) ABSTRACT

A photoconductive switch having a wide bandgap semiconductor material substrate between opposing electrodes, with one of the electrodes having an aperture or apertures at an electrode-substrate interface for transversely directing radiation therethrough from a radiation source into a triple junction region of the substrate, so as to geometrically constrain the conductivity path to within the triple junction region.

10 Claims, 8 Drawing Sheets

TRANSVERSELY-ILLUMINATED HIGH CURRENT PHOTOCONDUCTIVE SWITCHES WITH GEOMETRY-CONSTRAINED CONDUCTIVITY PATH

CLAIM OF PRIORITY IN PROVISIONAL APPLICATIONS

This patent document claims the benefit and priorities of U.S. Provisional Application No. 61/656,467, filed on Jun. 6, 2012, U.S. Provisional Application No. 61/656,470, filed on Jun. 6, 2012, and U.S. Provisional Application No. 61/801,483, filed on Mar. 15, 2013, all of which are hereby incorporated by reference

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to photoconductive switches, and in particular to a transversely-illuminated high current photoconductive switch or optical transconductance varistor with geometry-constrained conductivity path.

BACKGROUND

Photoconductive switches and switch packages typically consist of a wide bandgap photoconductive material (such as GaN, ZnO, diamond, AIN, SiC, BN, etc.), a source for energetic photons (e.g. a laser), a method to couple the laser into the switch, and a method for high voltage to enter and leave the switch package such as via electrodes positioned on opposite sides of the substrate. Arranged as such, the photoconductive switch package may be characterized as a three terminal device similar to transistors; with one of the terminals being a laser input or the voltage input to the laser system. When the photoconductive switch material is illuminated such as by a laser, the laser photons change the conductivity of the photoconductive material and make it viable as an optically controlled switch, capable of operating in the linear mode. Various package configurations and methods are known for feeding the high voltage into the switch package (while maintaining low capacitance and inductance), reducing detrimental electric field effects, optical coupling methods, and extracting high voltage and high current from the switch package.

SUMMARY

In one example implementation, the present invention includes a photoconductive switch comprising: a wide bandgap semiconductor material substrate; and electrodes in contact with said substrate, wherein one of said electrodes has an aperture at an electrode-substrate interface for transversely directing radiation therethrough from a radiation source into a triple junction region of the substrate.

In another example implementation, the present invention includes an optical transconductance varistor comprising: a wide bandgap semiconductor material substrate, whose conduction response to changes in amplitude of incident radiation that is substantially linear throughout a non-saturation region thereof, whereby the substrate is operable in non-avalanche mode as a variable resistor; and electrodes in contact with said material, wherein one of said electrodes has an aperture at an electrode-substrate interface for transversely directing radiation therethrough from a radiation source into a triple junction region of the substrate.

These and other implementations and various features and operations are described in greater detail in the drawings, the description and the claims.

The present invention is generally directed to a transversely illuminated/fed optically controlled high power switch configuration which optically confines the illuminating light (optical energy) to the center region or triple junction region of a material substrate e.g. a photoconductive, semi-insulating, or semi-conducting material, hereinafter collectively referred to as photoconductive material for convenience, located between opposing electrodes so that areas of the substrate outside the triple junction region are not illuminated and rendered conductive. As such the induced conductivity of the substrate is geometrically constrained/confined to the triple junction region to mitigate photon loss as the laser propagates through the switch (due to absorption of photons) and increases the efficiency of use of laser photons.

Figure 1:
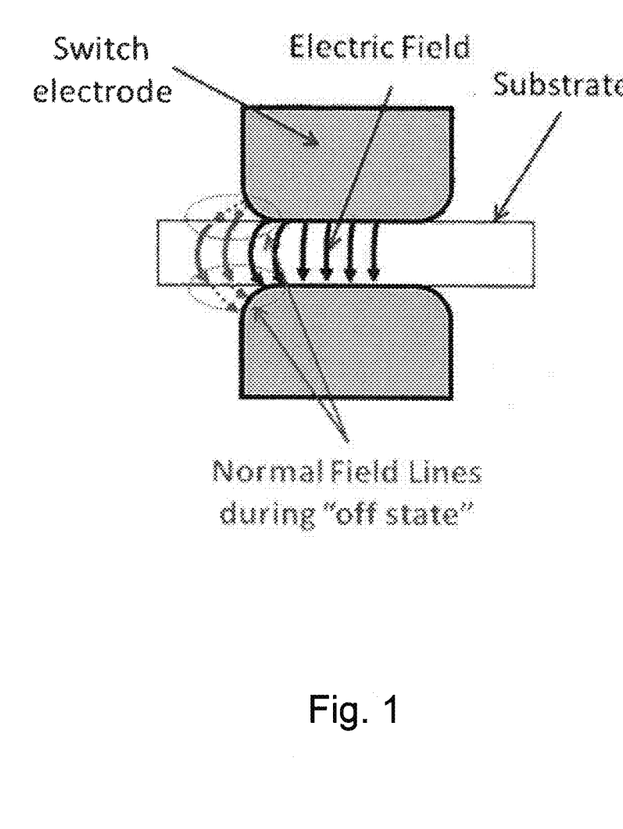
FIG. 1 shows a schematic side view of an example photoconductive switch showing normal electric field lines during an off state of the switch.
Figure 2:
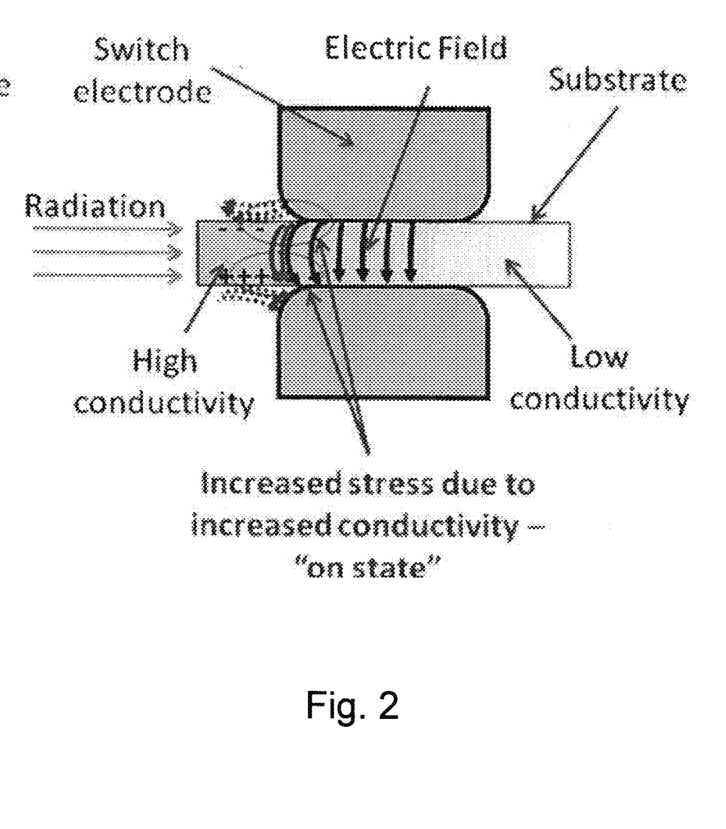
FIG. 2 shows a schematic side view of the example photoconductive switch of FIG. 1 showing increased stress due to increased conductivity during an on state of the switch due to illumination.

In particular, the approach of the present invention illuminates the photoconductive material from a transverse direction with respect to the planar material, and in an axial direction with respect to the switch electrodes. As such, reference to both transverse illumination and axial illumination are intended to characterize the same directionalized illumination into the substrate via an aperture or apertures through the electrodes. This is different from most photoconductive switches which are typically illuminated (fed) from the side or edge of the photoconductive material, i.e. along a longitudinal direction of a planar switch, with electrodes transversely positioned on either side of the switch material. However, one principal disadvantage in this method of illumination is the amount of loss of the laser energy as the laser photons propagate through the photoconductive switch material in the longitudinal direction, which then makes illumination of a triple-junction region between opposing electrodes inefficient. As shown in FIGS. 1 and 2, it can be seen that the region of the semiconductor that does not have physical electrode attachment cannot be excited by the radiation that renders the bulk of the crystal conductive. When the switch is in the "off state" as shown in FIG. 1, the normal field lines can terminate on the surface of the substrate. Under these conditions, the field lines obey the normal boundary conditions specified by Maxwell's equations. When the substrate is rendered conductive by the radiation source, as shown in FIG. 2, the condition of "Ohms Law" in general form must be fulfilled. That is J=E, where J is the current density and E is the applied electric field. In this case, an electric field line that does terminate on an electrode supplies current to that electrode. A field line that does not terminate on an electrode will generate a surface charge at the boundary interface between the substrate and the non-conductive surrounding media. That net charge will distort the applied electric field as to enhance the fields at the point where the electrode ends and cause catastrophic breakdown. The present invention is intended to mitigate this issue by transversely illuminating the triple junction region of the photoconductive material (i.e. substrate) directly between opposing electrodes so that no portion outside the triple junction region is activated to conduct.

Variations of the present invention may include, for example: using a suitably small aperture on axis to prevent enhancement of the electric field at the optical aperture; using a diffuser so that the light coming through the aperture is divergent so as to fill the substrate volume with light; and treating (e.g. with reflective coating) and shaping the opposite electrode(s) in such a manner so as to reflect the light multiple bounces and/or to go multiple bounces in a directed fashion to keep it within the substrate following a multi-path photon path to allow substantially total capture of available photons. Furthermore, as an added safeguard, the upper and lower surfaces of the substrate could also be rendered conductive, such as by or by employing conductive liners on the entire substrate surface, or on a portion of the substrate surface, such as for example described in U.S. Pat. Publication 2011/0101376, incorporated by reference herein.

Some of the advantages of the present invention include high-current electrode capability, use of reflective (non-transparent) electrodes in order to constrain the photon path, allows for complete absorption of the photons (as they pass through volumes of material), the photon path is centered on the region under the electrodes, and the conductivity profile (during photon illumination) falls off towards the edges of the electrodes. Additionally by optically confining the incident optically energy this can greatly increase the efficiency of the use of optical energy in the system and to normalize. Optical confined may be enhanced by edge treatment of the switch (using a reflective coating) to prevent loss of optical energy out of the switch. By inserting optical energy into the switch from the transverse (axial) direction and then prevent it from leaving via the longitudinal (edge) direction, the optical energy may be substantially completely consumed.

As used herein and in the claims, the triple junction region is that region of the substrate located between a first triple junction boundary region defined between the substrate and a first electrode, and a second triple junction boundary region defined between the substrate and a second electrode. In particular, FIGS. 9-12 illustrate and define the triple junction region formed between a first triple junction boundary region and a second triple junction boundary region. The switch material may be photoconductive, or semi-insulating or semi-conducting, and may be induced to conduct by an electromagnetic radiation source, or a particle radiation source.

It is also appreciated that by optically exciting wide bandgap materials, the conductivity of bulk of the material is modulated. In such a device, the entirety of the crystal participates in the conduction process. For instance, a 100 micron thick crystal will have the capability approaching 40 kV and would replace ten equivalent junction devices. Thus, unlike junction devices, the wide bandgap material can be made arbitrarily thick to accommodate higher voltages in a single device. Furthermore, there is both a linear region and a saturation region as is with a typical transistor device. Thus, when the material is operated in the linear region, amplification of an applied modulation to the optical pulse will result in amplification of the applied signal. Such a device may consist of the modulation input to the radiation source (whether it be a laser, particle source, or x-ray source) and the wide bandgap semiconductor material. The terminals would then be the common electrode, the input to the modulation source, and the output terminal. Because this device is similar to a "transconductance varistor," or more commonly called a "transistor," such as device may be we characterized as an optical transconductance varistor, or "opticondistor."

DETAILED DESCRIPTION

Figure 3:
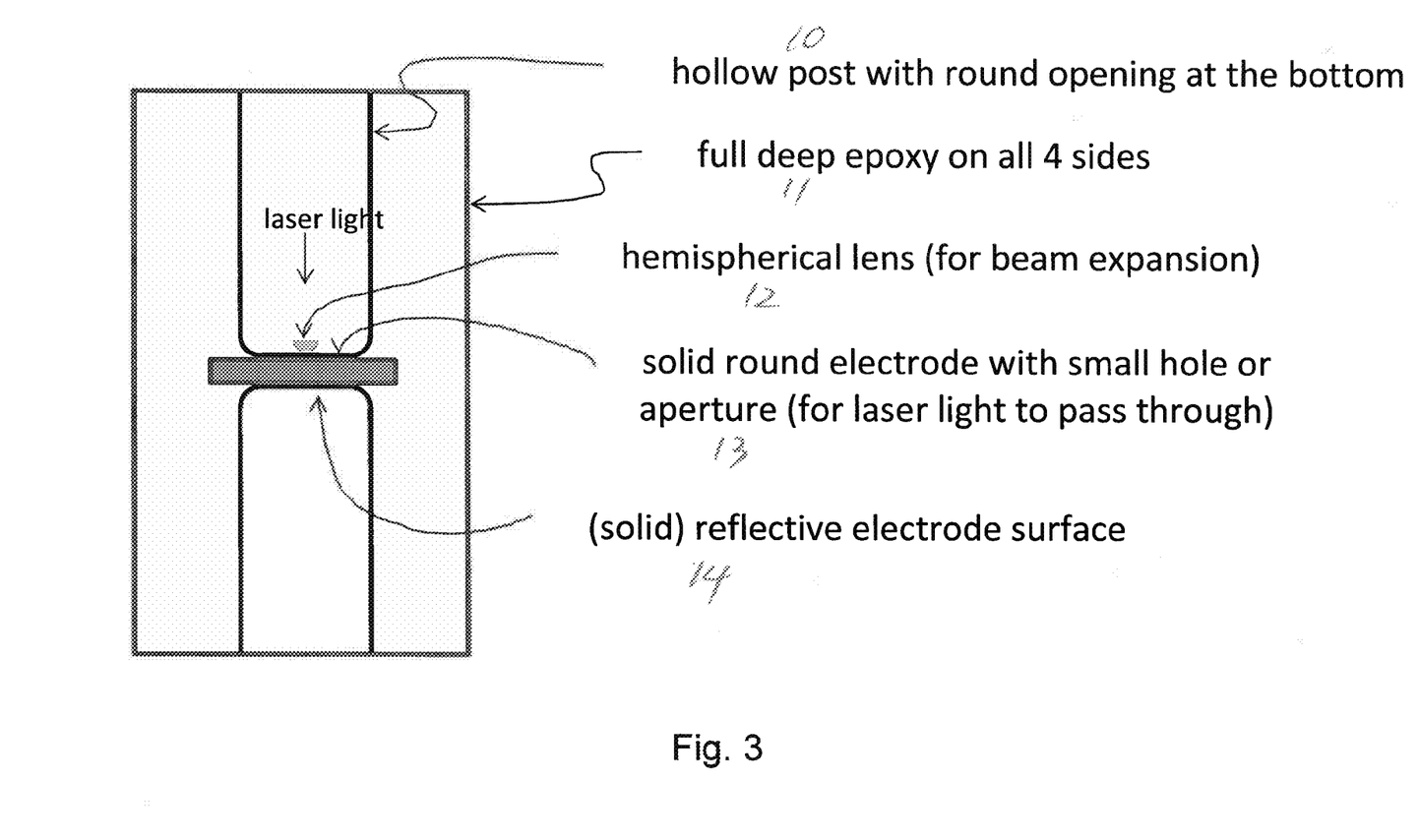
FIG. 3 shows an example embodiment of the photoconductive switch of the present invention having a single aperture through a hollow electrode with a hemispheric lens positioned to disperse/diffuse light through the aperture and into the substrate.

Turning now to the drawings, FIG. 3 shows an example embodiment of the transversely-illuminated photoconductive switch or optical transconductance varistor ("opticondistor") of the present invention. In particular, the switch configuration is shown having two opposing electrodes, shown as hollow cylindrical posts, with a wide bandgap photoconductive material substrate in contact therebetween. A non-conductive material (e.g. epoxy) is also shown surrounding the electrodes and the substrate. The photoconductive switch material can be in various shapes, such as for example, circular or round (e.g. a disk or flat cylinder) or square (e.g. a block), or non-parallel shapes, etc. An aperture (e.g. a small hole) is provided at the end of the upper electrode adjacent the substrate, for laser light to pass through.

A lens (shown as a hemispheric lens) is also shown provided to expand the laser beam and illuminate the triple point region of the switch. The laser beam may either be guided/transported in a fiber or through the air, for example. Beams from small-core fibers naturally diverge so a lens isn't typically required, however a lens may be used for other-sized fibers and through-air beams. And various types of lens may be used, such as for example spherical lens, hemispherical lens, a hollow sphere with reflective inner surface, or other reflective/refractive structure that expands/diffuses/disperses radiation through the aperture and into the triple junction region. In this regard, a lens, or other refractive surfaces, elements, or media may be used to expand the laser beam to illuminate the switch. The refractive surfaces, elements, or media can stand-alone or be integrated on or within the switch. Examples of refractive surfaces or media are lens, axicons, high refractive index polymers/coatings, etc. Or in the alternative, the use of diffractive surfaces, elements, or media may be more optimal in producing a uniform illumination distribution. As with the refractive surfaces, elements, or media, the diffractive surfaces, elements, or media can stand-alone or be integrated on or within the switch as well. Examples of diffractive surfaces or media: any obstructing object provides multiple, closely spaced openings, such as diffraction gratings, micro lens arrays, Fresnel zones, prism, diffusive features, etc.

Figure 4:
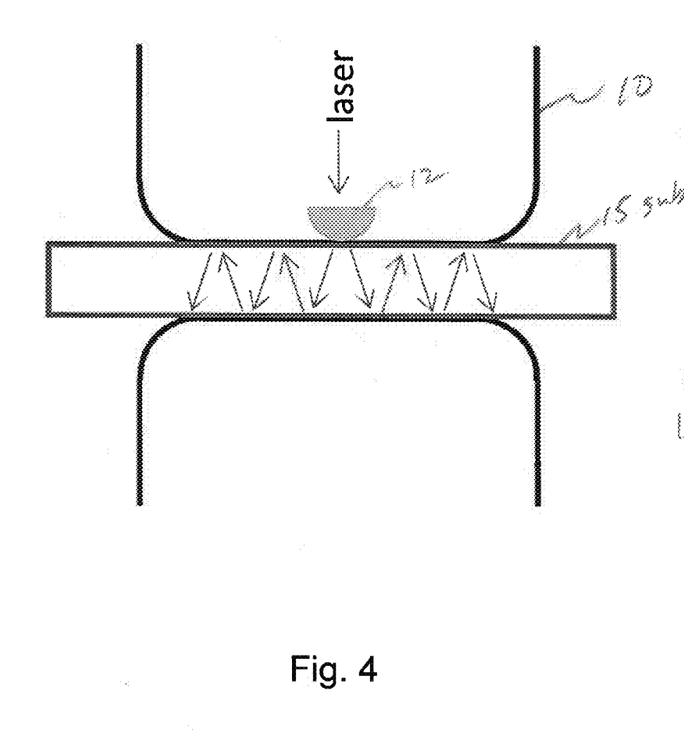
FIG. 4 shows the photoconductive switch of FIG. 3 showing the dispersive effects of the lens or other diffuser along the longitudinal direction of the substrate.

As shown in FIG. 4, the laser beam then passes through the aperture into the photoconductive switch material substrate to change the conductivity of the material (and is partially absorbed in the process). When the beam reaches the lower electrode, it may be reflected off of a reflective surface of the electrode if provided. Furthermore, if a reflective surface is also provided on the electrode-substrate interface of the electrode having the aperture, the beam then continues the transit back up to the upper electrode and reflects off of that reflective surface. It is understood that a small portion of the beam may go back up through the small hole and is lost. As the beam reflects off of the reflective surfaces, photons are absorbed by the photoconductive switch which produces a photon intensity profile which falls off from the centerline of the switch. Light propagates out towards the edges of the switch according to a diffusion profile and absorption profile. As light propagates out from near the center (entry point) of the wideband photoconductive material, reduction in optical intensity occurs due to $1/r^2$ diffusion, and to a lesser extent, to absorption in the crystal. This fall-off function to minimize the effect of the electric field at the edges of the cylindrical electrode and deposited electrode (high electric field stress causes electric field breakdown through the switch and catastrophic failure of the switch).

Figure 5:
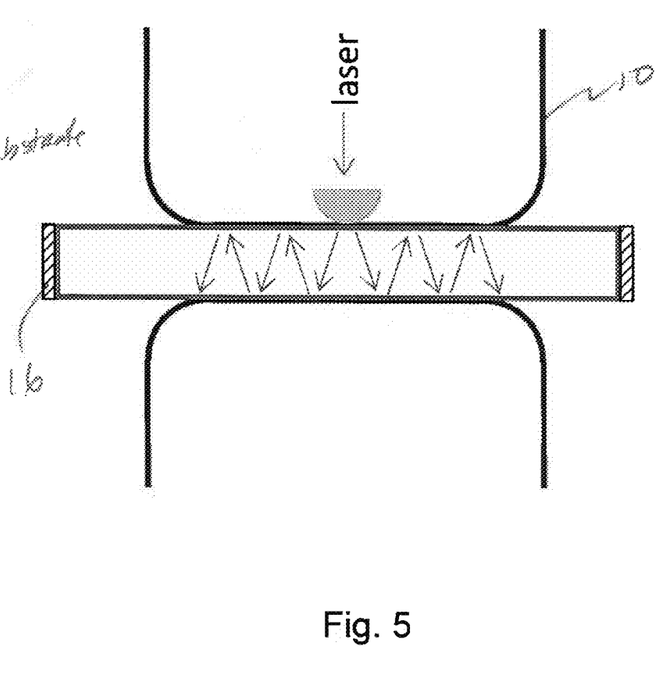
FIG. 5 shows another example embodiment of the photoconductive switch similar to FIG. 4, but having a reflective surface on the sides/edges to keep/guide light in the substrate.

FIG. 5 shows the sides or edges of the substrate coated with a reflective material, such as known in the art (including for example dielectric high reflectivity thin films) to longitudinally confine (at the edges) the optical energy from exiting the switch along this direction. The optical energy is then reflected back into the bulk of the switch volume for continued utilization, until consumed. In the case of laser excitation producing the optical energy, the edge-based reflective coating may consist of a dielectric layer tuned to the wavelength of the laser. Note that if configured as a high-voltage holding device, a metallic reflective layer specifically cannot be used in this application. In another example embodiment, a dielectric encapsulant (such as shown in FIG. 3) may be provided to act as the reflective mechanism. Typically, for voltage holding purposes, the dielectric constant of the encapsulant may be matched to that of the switch. In this case, no reflectivity is provided at the switch/encapsulant interface. However, by using an encapsulant that has a higher dielectric constant that the switch material, a reflective surface is obtained without the need to provide a separate reflective coating on the longitudinal (edge) surfaces. For example, a $BaSrTiO_3$ encapsulant (common in high voltage capacitors) would produce an electric field reflection of 96% at the switch/encapsulant interface.

Figure 6:
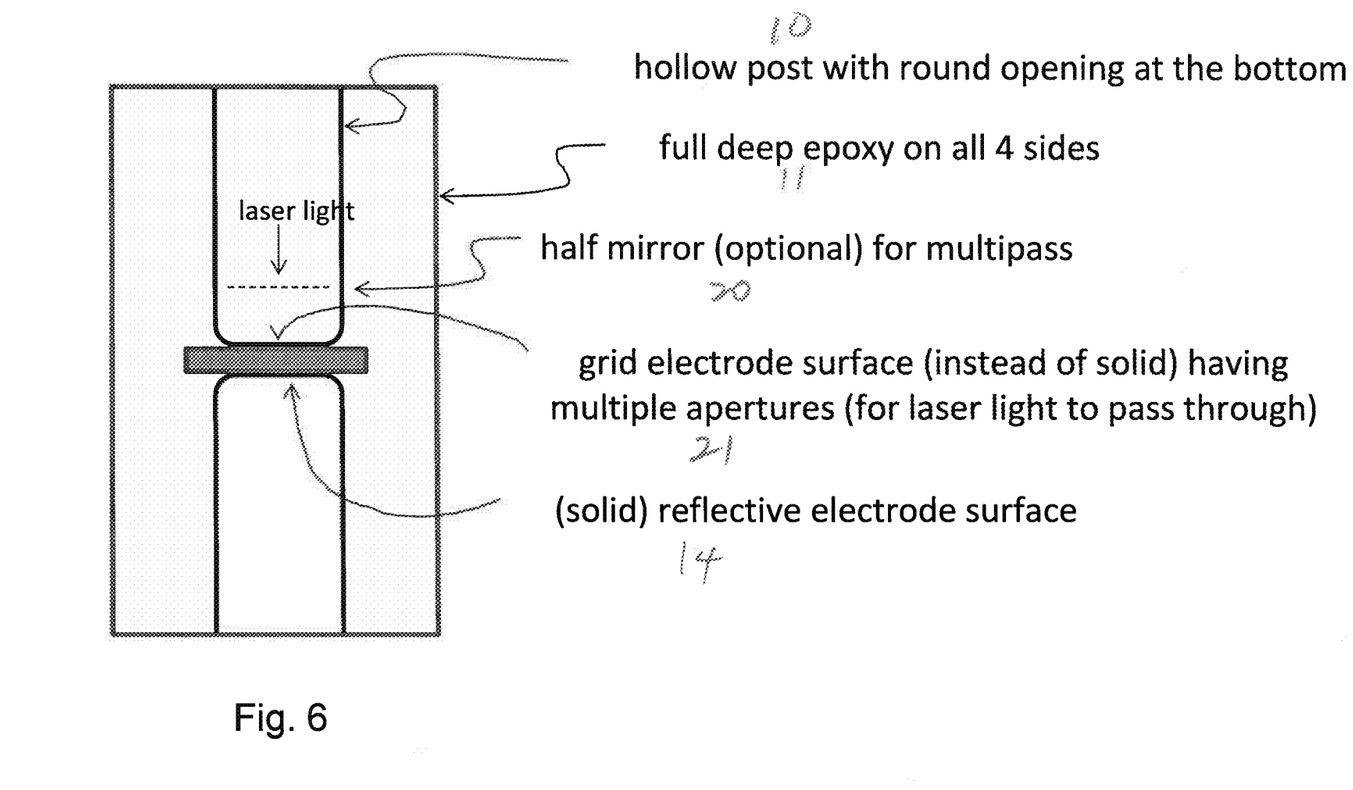
FIG. 6 shows a another example embodiment similar to FIG. 3, but having a wire grid electrode with apertures to pass light therefore, and a reflective mirror (fully reflective, with a hole; or partially reflective to reflect the light back down towards the switch so that photon utilization is efficient half mirror for multipass operation.

In FIG. 6, an alternate example embodiment is shown having a conductive wire grid which is used as the electrode to allow the laser beam to enter the photoconductive switch (and a wire grid electrode supports the high currents experienced on this surface) through multiple grid apertures. The wire grid may be deposited on the photoconductive surface or discrete as part of the cylindrical electrode. A reflective minor (e.g. fully reflective, with a hole, or partially reflective) is also shown provided to reflect the light back down towards the switch so that photon utilization is efficient. And as an alternative to a conductive wire grid which may be used as the electrode to allow the laser beam to enter the photoconductive switch (and a wire grid electrode supports the high currents experienced on this surface), transparent conductive coatings/films, and the combination or hybrid of a grid with a coating/film to produce a "continuous" conductive surface may be used. Another advantage of the hybrid approach is that a smoother planar surface can be achieved.

For the embodiments shown in FIGS. 3-6, the bottom cylindrical electrode (which may be solid or hollow) may have a polished electrode surface to provide a high degree of reflectivity to the incident laser photons. Additionally, a thin electrode may be deposited on the surface of the photoconductive switch (typically with a round profile to minimize electric field stress), and then the larger metal electrodes make contact with that deposited electrode. In this case, for the implementation described here, it is the deposited electrodes that have a polished reflective surface which typically implies that those surfaces of the photoconductive switch are polished also, then metalized with a profile matching that of the cylindrical electrodes.

Figure 7:
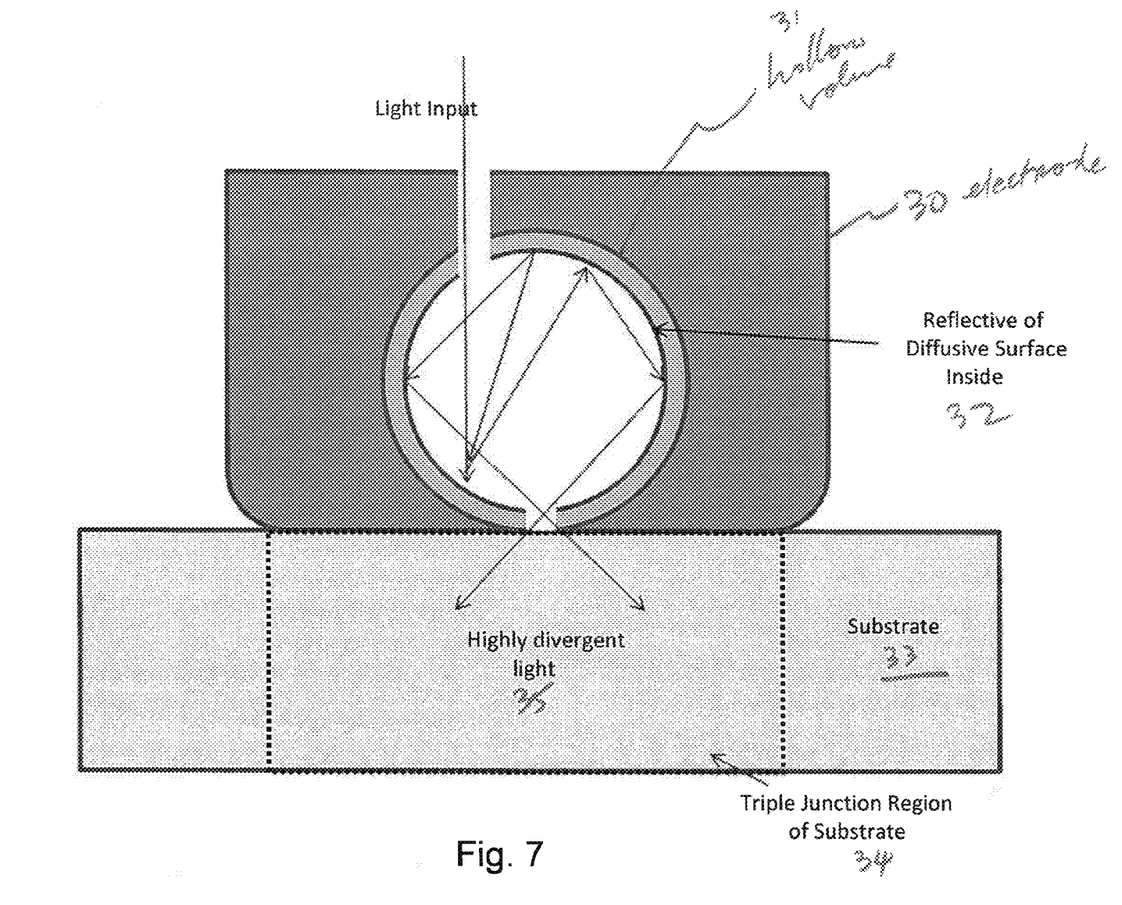
FIG. 7 shows another example embodiment of the transversely illuminated photoconductive switch having a hollow volume connected to the aperture for producing divergent light/radiation through the aperture.

FIG. 7 shows another example embodiment having a hollow volume in the electrode configured to randomize the incoming light input to produce a highly divergent light passing through the aperture. The hollow volume is particularly shown as a hollow sphere to diverge the light through the aperture. In particular, the hollow sphere is shown having an inner surface that may be either reflective or diffusive. Such a device will accept the light exiting, say a fiber or the laser itself, and make it more divergent. The divergence of the light can then more fully illuminate the substrate within the triple junction region, which is the substrate region bounded by and within the triple junction boundary defined between opposing triple junctions of the electrodes. While the transverse laser illumination may be delivered via a small hole at the end of the upper (hollow cylindrical) electrode, at high incident angles, the hollow cylindrical electrode may generate a specular reflection resulting in the concentration of the light towards the center of the switch. In some circumstances, a uniform illumination distribution within the switch is desired and the minimization of the high angle specular reflection is required. This can be achieved by, for example: texturing the inside of the hollow electrode (small scale mechanical structures), applying a diffuse coating or paint, or the use of multiple fibers, such as a fiber bundle to fill the area of the hollow electrode. Although shown as a sphere, various shapes may be used to accommodate various characteristics of the laser beam. And the triple junction region is shown in FIG. 7 as the central region of the substrate bounded by a boundary formed along the triple junction points.

Figure 8:
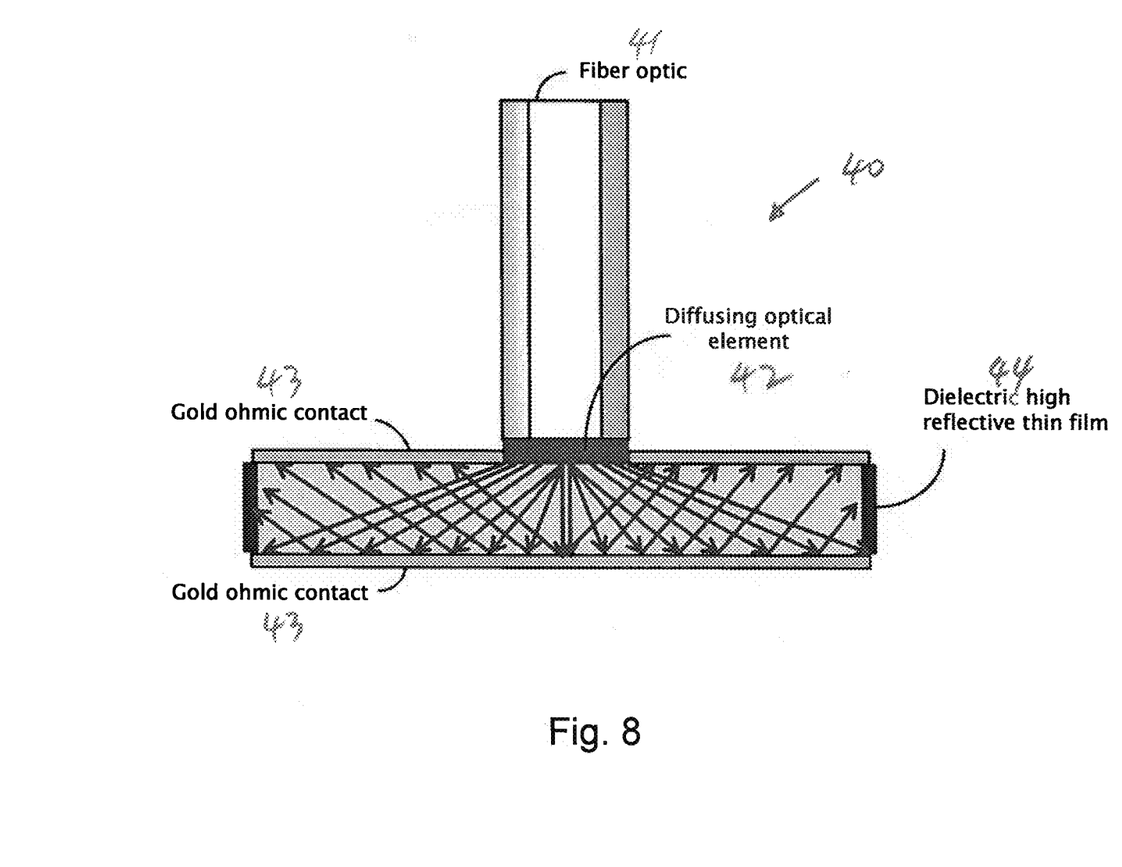
FIG. 8 shows another example embodiment of the transversely illuminated photoconductive switch having a fiber optic connected to pass light through a diffusing optical element located between the fiber optic and the substrate.
Figure 9:
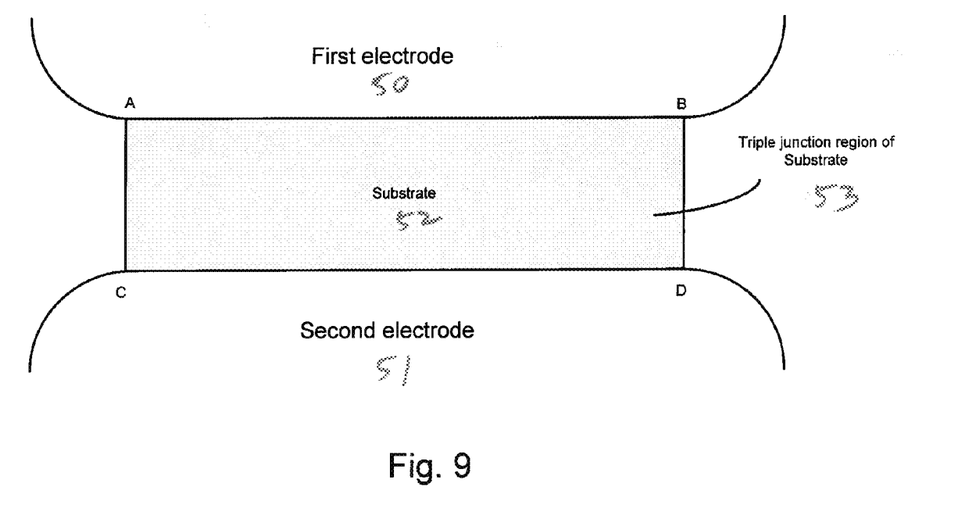
FIGS. 9-12 illustrate and define the triple junction region of the present invention in terms of first and second triple junction boundary regions.
Figure 10:
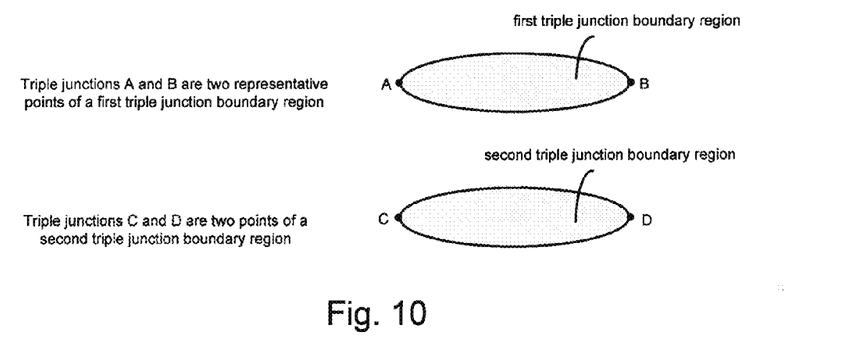
Figure 11:
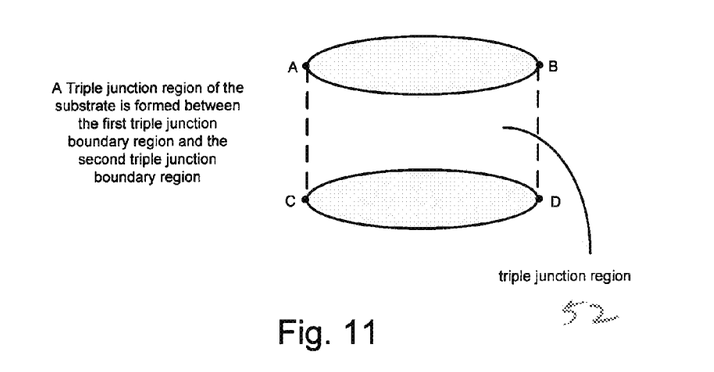
Figure 12:
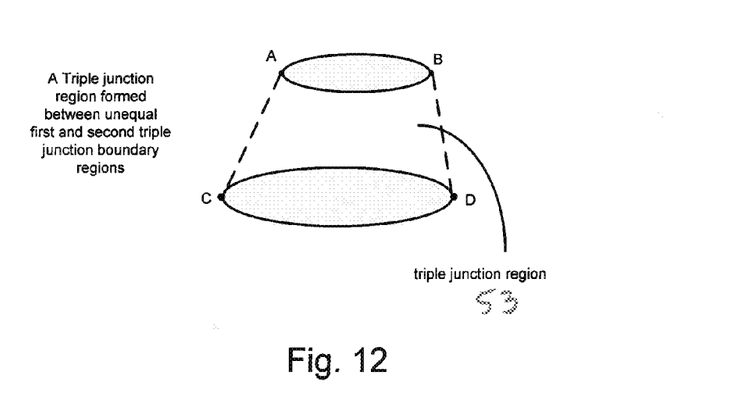

And FIG. 8 shows another example embodiment of the transversely illuminated photoconductive switch and optical transconductance varistor of the present invention having a fiber optic for directing light through an aperture at an end thereof into the substrate. A diffusing optical element is also shown for diffusing/dispersing light. While the electrodes are not shown, ohmic contacts (e.g. gold ohmic contacts) are shown which act as a reflective mirror surface which keeps the light in the substrate. A dielectric high reflective thin film is also shown provided at the sides or edges of the substrate such that all surfaces of interfaces of the substrate, excluding the aperture and the diffusing element, are reflective.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A photoconductive switch comprising:
   a wide bandgap semiconductor material substrate;
   a conductive liner on a surface of the wide bandgap semiconductor material substrate; and
   electrodes in contact with said wide bandgap semiconductor material substrate, wherein one of said electrodes has an optical aperture interfacing the conductive liner so that the conductive liner bridges the electrode across the optical aperture, said optical aperture for transversely directing radiation from a radiation source, through the conductive liner, and into a triple junction region of said wide bandgap semiconductor material substrate.

2. The photoconductive switch of claim 1,
   wherein the electrode having the optical aperture includes a disperser for dispersing said radiation into the triple junction region.

3. The photoconductivefs switch of claim 1,
   wherein one of said electrodes does not have an optical aperture and is reflective at the electrode-substrate interface.

4. The photoconductive switch of claim 1,
   wherein the wide bandgap semiconductor material substrate has reflective surfaces to keep said radiation in the substrate.

5. The optical transconductance varistor of claim 1,
   wherein the conductive liner is a conductive wire grid.

6. An optical transconductance varistor comprising:
   a wide bandgap semiconductor material substrate, wherein conduction response of said wide bandgap semiconductor material substrate to changes in amplitude of incident radiation is substantially linear throughout a non-saturation region thereof, whereby the wide bandgap semiconductor material substrate is operable in non-avalanche mode as a variable resistor;
   a conductive liner on a surface of the wide bandgap semiconductor material substrate; and
   electrodes in contact with said wide bandgap semiconductor material substrate, wherein one of said electrodes has an optical aperture interfacing the conductive liner so that the conductive liner bridges the electrode across the optical aperture, said optical aperture for transversely directing radiation from a radiation source, through the conductive liner, and into a triple junction region of the wide bandgap semiconductor material substrate.

7. The optical transconductance varistor of claim 6,
   wherein the electrode having the optical aperture has a disperser for dispersing said radiation into the triple junction region.

8. The optical transconductance varistor of claim 6,
   wherein one of said electrodes does not have an optical aperture and is reflective at the electrode-substrate interface.

9. The optical transconductance varistor of claim 6,
   wherein the wide bandgap semiconductor material substrate has reflective surfaces to keep said radiation in the substrate.

10. The optical transconductance varistor of claim 6,
   wherein the conductive liner is a conductive wire grid.

* * * * *